United States Patent
Nakamura et al.

(10) Patent No.: US 9,232,642 B2
(45) Date of Patent: Jan. 5, 2016

(54) WIRING SUBSTRATE, METHOD FOR MANUFACTURING THE WIRING SUBSTRATE, AND SEMICONDUCTOR PACKAGE

(71) Applicant: SHINKO ELECTRIC INDUSTRIES CO., LTD., Nagano (JP)

(72) Inventors: Junichi Nakamura, Nagano (JP); Michiro Ogawa, Nagano (JP); Kazuhiro Kobayashi, Nagano (JP); Hiromi Denda, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 199 days.

(21) Appl. No.: 13/936,443

(22) Filed: Jul. 8, 2013

(65) Prior Publication Data
US 2014/0021625 A1  Jan. 23, 2014

(30) Foreign Application Priority Data
Jul. 20, 2012  (JP) ................. 2012-161067

(51) Int. Cl.
| | |
|---|---|
| *H01L 23/373* | (2006.01) |
| *H05K 1/02* | (2006.01) |
| *H01L 23/48* | (2006.01) |
| *H01L 25/10* | (2006.01) |
| *H05K 3/46* | (2006.01) |
| *H01L 23/14* | (2006.01) |
| *H01L 23/498* | (2006.01) |
| *H01L 23/485* | (2006.01) |

(52) U.S. Cl.
CPC ............ *H05K 1/0298* (2013.01); *H01L 23/145* (2013.01); *H01L 23/48* (2013.01); *H01L 23/49822* (2013.01); *H01L 25/105* (2013.01); *H05K 3/4682* (2013.01); *H01L 23/373* (2013.01); *H01L 23/3731* (2013.01); *H01L 23/3733* (2013.01); *H01L 23/3735* (2013.01); *H01L 23/485* (2013.01); *H01L 2224/13111* (2013.01); *H01L 2224/16238* (2013.01); *H01L 2224/32225* (2013.01); *H01L 2224/48091* (2013.01); *H01L 2224/48229* (2013.01); *H01L 2224/73204* (2013.01); *H01L 2225/1023* (2013.01); *H01L 2225/1058* (2013.01); *H05K 2201/068* (2013.01); *H05K 2201/096* (2013.01)

(58) Field of Classification Search
CPC ..................... H01L 23/373; H01L 23/3731
See application file for complete search history.

(56) References Cited

U.S. PATENT DOCUMENTS

| | | | |
|---|---|---|---|
| 7,397,000 | B2 | 7/2008 | Shimoto et al. |
| 7,566,834 | B2 | 7/2009 | Shimoto et al. |

(Continued)

FOREIGN PATENT DOCUMENTS

| | | |
|---|---|---|
| JP | 09-237972 | 9/1997 |
| JP | 3537620 | 6/2004 |

(Continued)

*Primary Examiner* — William Harriston
(74) *Attorney, Agent, or Firm* — IPUSA, PLLC

(57) ABSTRACT

A wiring substrate includes an insulating layer including a reinforcement member and having a first surface and a second surface positioned on an opposite side of the first surface, an electrode pad exposed from the first surface, a layered body including first insulating layers and being formed on the second surface, the first insulating layers having a first insulating material as a main component, another layered body including second insulating layers and being formed on the layered body, the second insulating layers having a second insulating material as a main component, and another electrode pad exposed from a surface of the another layered body that is opposite to the layered body. The number of the first insulating layers is equal to that of the second insulating layers. The first insulating layers have a thermal expansion coefficient that is greater than that of the second insulating layers.

7 Claims, 5 Drawing Sheets

(56) References Cited

U.S. PATENT DOCUMENTS

2005/0236180 A1* 10/2005 Sarma et al. .................. 174/256
2009/0236135 A1* 9/2009 Ueda et al. ................... 174/260

FOREIGN PATENT DOCUMENTS

| | | |
|---|---|---|
| JP | 2006-237324 | 9/2006 |
| JP | 4108643 | 6/2008 |
| JP | 2009-224739 | 10/2009 |

* cited by examiner

WIRING SUBSTRATE, METHOD FOR MANUFACTURING THE WIRING SUBSTRATE, AND SEMICONDUCTOR PACKAGE

CROSS-REFERENCE TO RELATED APPLICATIONS

This application is based upon and claims the benefit of priority of the prior Japanese Patent Application No. 2012-161067 filed on Jul. 20, 2012, the entire contents of which are incorporated herein by reference.

FIELD

The embodiments discussed herein are related to a wiring substrate, a method for manufacturing the wiring substrate, and a semiconductor package.

BACKGROUND

Conventionally, there is known a coreless wiring substrate having a predetermined number of insulating layers and wiring layers alternately layered one on top of the other. The wiring substrate has one surface on which a semiconductor chip is mounted (semiconductor chip mounting surface) and another surface to which an external connection terminal is bonded (external connection terminal bonding surface). Among the insulating layers of the wiring substrate, glass cloth is included in the insulating layer that includes the external connection terminal bonding surface and is not included in the other insulating layers. The insulating layers that do not include the glass cloth are formed of the same insulating resin and are adjusted to have substantially the same thermal expansion coefficient (see, for example, Japanese Laid-Open Patent Publication No. 2009-224739).

SUMMARY

According to an aspect of the invention, there is provided a wiring substrate including: an insulating layer including a reinforcement member and having a first surface and a second surface positioned on an opposite side of the first surface; a first electrode pad that is exposed from the first surface of the insulating layer including the reinforcement member; a first layered body including a plurality of first insulating layers and being formed on the second surface of the insulating layer including the reinforcement member, the plurality of first insulating layers having a first insulating material as a main component; a second layered body including a plurality of second insulating layers and being formed on the first layered body, the plurality of second insulating layers having a second insulating material as a main component; and a second electrode pad that is exposed from a surface of the second layered body that is opposite to the first layered body; wherein the number of the plurality of first insulating layers is equal to the number of the plurality of second insulating layers, wherein the plurality of first insulating layers has a thermal expansion coefficient that is greater than a thermal expansion coefficient of the plurality of second insulating layers.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
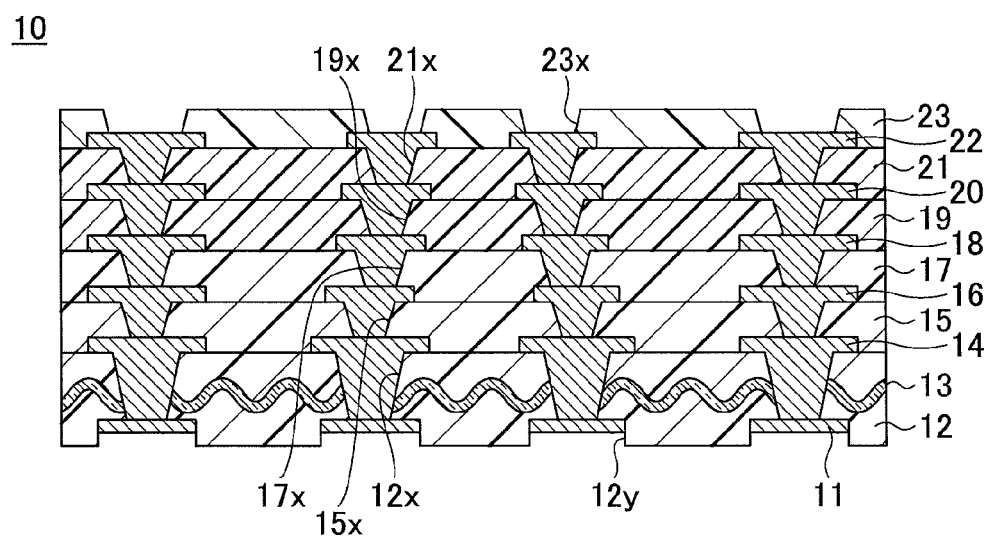
FIG. 1 is a cross-sectional view of a wiring substrate according to a first embodiment of the present invention.

In a case where a wiring substrate has a plurality of insulating layers including an insulating layer that includes a glass cloth and insulating layers including no glass cloth, the inventors of the present invention have found that, it is difficult to reduce warping of the wiring substrate when the thermal coefficients of the insulating layers including no glass cloth are adjusted to be substantially the same.

In view of the above, embodiments of the present invention are described with reference to the accompanying drawings. Throughout the drawings, like components/parts are denoted with like reference numerals. Thus, detailed descriptions of like components/parts denoted with like reference numerals are omitted.

<First Embodiment>
Structure of Wiring Substrate According to First Embodiment of the Present Invention First, a structure of a wiring substrate 10 according to a first embodiment of the present invention is described. FIG. 1 is a cross-sectional view of the wiring substrate 10 according to the first embodiment of the present invention. The wiring substrate 10 illustrated in FIG. 1 includes a wiring layer 11, an insulating layer 12, glass cloth 13, a wiring layer 14, an insulating layer 15, a wiring layer 16, an insulating layer 17, a wiring layer 18, an insulating layer 19, a wiring layer 20, an insulating layer 21, a wiring layer 22, and a solder resist layer 23. The wiring substrate 10 is a coreless built-up wiring substrate.

In FIG. 1 and its corresponding description, for the sake of convenience, the term "one side" or the term "one surface" corresponds to a side or a surface that is positioned toward the insulating layer 12, and the term "other side" or the term "other surface" corresponds to a side or surface that is positioned toward the solder resist layer 23. For example, an exposed surface of the insulating layer 12 facing outward may be referred to as "one surface of the insulating layer 12", and a surface of the insulating layer 12 contacting the insulating layer 15 may be referred to as "other surface of the insulating layer 12".

In the wiring substrate 10, one surface of the wiring layer 11 is exposed in a recess part 12y provided in one surface of the insulating layer 12. In other words, the one surface of the wiring layer 11 is positioned more toward the insulating layer 15 than the one surface of the insulating layer 12. For example, copper (Cu) may be used as the material of the wiring layer 11. The thickness of the wiring layer 11 may be, for example, approximately 10 μm to 20 μm. The depth of the recess part 12y (distance from the one surface of the insulating layer 12 to the one surface of the wiring layer 11) may be, for example, approximately 10 μm to 20 μm.

The wiring layer 11 exposed outward from the one surface of the insulating layer 12 functions as an external connection pad to which a mounting substrate (not illustrated) such as a motherboard is to be electrically connected. The wiring layer 11 exposed outward from the one surface of the insulating layer 12 has, for example, a circular shape, from a plan view. The diameter of the circular shape may be, for example, approximately 200 μm to 1000 μm. The pitch between the wiring layers 11 exposed outward from the one surface of the insulating layer 12 may be, for example, approximately 500 μm to 1200 μm.

The insulating layer 12 covers the other surface of the wiring layer 11 (excluding a portion of the wiring layer 11 contacting the below-described via wiring of the wiring layer 14) and a side surface of the wiring layer 11 and exposes the one surface of the wiring layer 11. The insulating layer 12 is a layer that has, for example, a thermosetting insulating resin impregnated in the glass cloth 13. The thermosetting insulating resin of the insulating layer 12 may have, for example, an epoxy resin as a main component. The thickness of the insulating layer 12 may be, for example, approximately 40 μm to 70 μm. The insulating layer 12 may include a filler such as silica ($SiO_2$) or alumina ($Al_2O_3$).

The glass cloth 13 includes a bundle of glass fibers (first glass fiber bundle) arranged in a predetermined first direction and another bundle of glass fibers (second glass fiber bundle) arranged in a second direction that is substantially orthogonal to the first direction. The first and second glass fiber bundles are plain woven to form a matrix-like pattern. The first and second glass fiber bundles may be formed with a width of approximately a few hundred μm by bundling a plurality of glass fibers together in which each of the glass fibers has a diameter of approximately a few μm. Alternatively, a non-woven glass fabric or an aramid fiber may be used instead of the glass cloth 13. The glass cloth 13, the non-woven glass fabric, and the aramid fiber are representative examples of a reinforcement member according to an embodiment of the present invention. Further, the insulating layer 12 is a representative example of an insulating layer including a reinforcement member according to an embodiment of the present invention.

The wiring layer 14 is formed on a side of the other surface of the insulating layer 12. More specifically, the wiring layer 14 is formed on the other surface of the insulating layer 12 and in via holes 12x that penetrate the insulating layer 12 and expose the other surface of the wiring layer 11. Thus, the wiring layer 14 is constituted by a via wiring filling the insides of the via holes 12x and a wiring pattern formed on the other surface of the insulating layer 12. The via hole 12x is a recess that is open on a side of the insulating layer 15 and has a circular truncated cone shape in which the area of an opening of the recess is larger than the area of the bottom surface of the recess. The diameter of the opening of the via hole 12x may be, for example, approximately 60 μm to 80 μm.

The wiring layer 14 is electrically connected to the wiring layer 11 exposed at a bottom part of the via hole 12x. For example, copper (Cu) may be used as the material of the wiring layer 14. The thickness of the wiring pattern constituting the wiring layer 14 may be, for example, approximately 10 μm to 20 μm.

The insulating layer 15 is formed on the other surface of the insulating layer 12 and covers the wiring layer 14. The material of the insulating layer 15 may be, for example, a thermosetting insulating resin having an epoxy resin as a main component. The thickness of the insulating layer 15 may be, for example, approximately 20 μm to 40 μm. The insulating layer 15 may include a filler such as silica ($SiO_2$) or alumina ($Al_2O_3$).

The wiring layer 16 is formed on a side of the other surface of the insulating layer 15. More specifically, the wiring layer 16 is formed on the other surface of the insulating layer 15 and in a via hole 15x that penetrates the insulating layer 15 and exposes the other surface of the wiring layer 14. Thus, the wiring layer 16 is constituted by a via wiring filling the inside of the via hole 15x and a wiring pattern formed on the other surface of the insulating layer 15. The via hole 15x is a recess that is open on a side of the insulating layer 17 and has a circular truncated cone shape in which the area of an opening of the recess is larger than the area of the bottom surface of the recess. The diameter of the opening of the via hole 15x may be, for example, approximately 60 μm.

The wiring layer 16 is electrically connected to the wiring layer 14 exposed at a bottom part of the via hole 15x. For example, copper (Cu) may be used as the material of the wiring layer 16. The thickness of the wiring pattern constituting the wiring layer 16 may be, for example, approximately 10 μm to 20 μm.

The insulating layer 17 is formed on the other surface of the insulating layer 15 and covers the wiring layer 16. The material of the insulating layer 17 may be, for example, a thermosetting insulating resin having an epoxy resin as a main component. The thickness of the insulating layer 17 may be, for example, approximately 20 μm to 40 μm. The insulating layer 17 may include a filler such as silica ($SiO_2$) or alumina ($Al_2O_3$).

The wiring layer 18 is formed on a side of the other surface of the insulating layer 17. More specifically, the wiring layer 18 is formed on the other surface of the insulating layer 17 and in a via hole 17x that penetrates the insulating layer 17 and exposes the other surface of the wiring layer 16. Thus, the wiring layer 18 is constituted by a via wiring filling the inside of the via hole 17x and a wiring pattern formed on the other surface of the insulating layer 17. The via hole 17x is a recess that is open on a side of the insulating layer 19 and has a circular truncated cone shape in which the area of an opening of the recess is larger than the area of the bottom surface of the recess. The diameter of the opening of the via hole 17x may be, for example, approximately 60 μm.

The wiring layer 18 is electrically connected to the wiring layer 16 exposed at the bottom parts of the via holes 17x. For example, copper (Cu) may be used as the material of the wiring layer 18. The thickness of the wiring pattern constituting the wiring layer 18 may be, for example, approximately 10 μm to 20 μm.

The insulating layer 19 is formed on the other surface of the insulating layer 17 and covers the wiring layer 18. The material of the insulating layer 19 may be, for example, a thermosetting insulating resin having an epoxy resin as a main component. The thickness of the insulating layer 19 may be, for example, approximately 20 μm to 40 μm. The insulating layer 19 may include a filler such as silica ($SiO_2$) or alumina ($Al_2O_3$).

The wiring layer 20 is formed on a side of the other surface of the insulating layer 19. More specifically, the wiring layer 20 is formed on the other surface of the insulating layer 19 and in a via hole 19x that penetrates the insulating layer 19 and exposes the other surface of the wiring layer 18. Thus, the wiring layer 20 is constituted by a via wiring filling the inside of the via hole 19x and a wiring pattern formed on the other surface of the insulating layer 19. The via hole 19x is a recess that is open on a side of the insulating layer 21 and has a circular truncated cone shape in which the area of an opening of the recess is larger than the area of the bottom surface of the recess. The diameter of the opening of the via hole 19x may be, for example, approximately 60 μm.

The wiring layer 20 is electrically connected to the wiring layer 18 exposed at a bottom part of the via hole 19x. For example, copper (Cu) may be used as the material of the wiring layer 20. The thickness of the wiring pattern constituting the wiring layer 20 may be, for example, approximately 10 μm to 20 μm.

The insulating layer 21 is formed on the other surface of the insulating layer 19 and covers the wiring layer 20. The material of the insulating layer 21 may be, for example, a thermosetting insulating resin having an epoxy resin as a main component. The thickness of the insulating layer 21 may be, for example, approximately 20 μm to 40 μm. The insulating layer 21 may include a filler such as silica ($SiO_2$) or alumina ($Al_2O_3$).

The wiring layer 22 is formed on a side of the other surface of the insulating layer 21. More specifically, the wiring layer 22 is formed on the other surface of the insulating layer 21 and in a via hole 21x that penetrates the insulating layer 21 and exposes the other surface of the wiring layer 20. Thus, the wiring layer 22 is constituted by a via wiring filling the inside of the via holes 21x and a wiring pattern formed on the other surface of the insulating layer 21. The via hole 21x is a recess that is open on a side of the solder resist layer 23 and has a circular truncated cone shape in which the area of an opening of the recess is larger than the area of the bottom surface of the recess. The diameter of the opening of the via hole 21x may be, for example, approximately 60 μm.

The wiring layer 22 is electrically connected to the wiring layer 20 exposed at a bottom part of the via hole 21x. For example, copper (Cu) may be used as the material of the wiring layer 22. The thickness of the wiring pattern constituting the wiring layer 22 may be, for example, approximately 10 μm to 20 μm.

The solder resist layer 23 is formed on the other surface of the insulating layer 21 and covers the wiring layer 22. The solder resist layer 23 includes an opening 23x having a bottom part at which a portion of the wiring layer 22 is exposed. At least the portion of the wiring layer 22 exposed at the bottom part of the opening 23x functions as a semiconductor chip connection pad to which a semiconductor chip is to be electrically connected. In other words, in this embodiment, the side of the solder resist layer 23 corresponds to the side of the wiring substrate 10 on which a semiconductor chip is to be mounted.

The wiring layer 22, which is exposed at the bottom part of the opening 23x, has, for example, a circular shape, from a plan view. The diameter of the circular shape may be, for example, approximately 40 μm to 120 μm. The pitch between the wiring layers 22 exposed at the bottom parts of the openings 23x may be, for example, 100 μm to 200 μm.

However, regarding the wiring layers 22 exposed at the bottom parts of the openings 23x, a portion(s) of the wiring layers 22 that is not connected to a semiconductor chip (i.e. a portion(s) of the wiring layer 22 that does not function as a connection pad to which a semiconductor chip is connected) may have a diameter greater than the aforementioned diameter of approximately 40 μm to 120 μm and a pitch greater than the aforementioned pitch of approximately 100 μm to 200 μm. For example, in a case of the below-described semiconductor package 70 (see FIG. 6), the portion(s) of wiring layer 22 may have a diameter greater than the aforementioned diameter of approximately 40 μm to 120 μm and a pitch greater than the aforementioned pitch of approximately 100 μm to 200 μm. That is, in the embodiment illustrated in FIG. 6, the wiring layers 22, which are exposed at the bottom parts of the openings 23x and connected to the semiconductor chip 60, may have a diameter and a pitch greater than those of the wiring layers 22 exposed at the bottom parts of the openings 23x and connected to the semiconductor chip 51.

According to necessity, a surface processing layer (i.e. a layer on which surface processing is performed) may be formed on the wiring layer 22 exposed at the bottom part of the opening 23x. The surface processing layer may be, for example, an Au layer, a Ni/Au (a metal layer including a Ni layer and an Au layer layered in this order), or a Ni/Pd/Au layer (a metal layer including a Ni layer, a Pd layer, and a Au layer layered in this order). Alternatively, the surface processing layer may be formed by performing an anti-oxidation process (e.g., OSP (Organic Solderability Preservative) process) on the wiring layer 22 exposed at the bottom part of the opening 23x.

In the wiring substrate 10, the wiring pattern constituting the wiring layer 22 may be drawn and formed on the other surface of the insulating layer 21. Thereby, the wiring pattern drawn to the other surface of the insulating layer 21 is exposed from the opening 23x of the solder resist layer 23, so that the wiring pattern may be used as a pad to which a semiconductor chip or the like is to be connected (semiconductor chip connection pad). That is, a portion(s) of the wiring layer 22 other than a portion(s) formed in the via hole 21x may be used as the semiconductor chip connection pad.

Next, a configuration of the insulating layers, which is one of the features of the wiring substrate 10, is described. In an example where the insulating layer 12 including the glass cloth 13 is the lowermost layer of the wiring substrate 10, the insulating layers 15, 17 are layered on the other surface of the insulating layer 12. A layered body including the insulating layer 15, the wiring layer 16, the insulating layer 17, and the wiring layer 18 is one example of a first layered body according to an embodiment of the present invention. In this example, a first insulating material is a main component of the insulating layers 15 and 17. For example, an epoxy type insulating resin may be used as the first insulating material.

The thermal expansion coefficients of the insulating layers 15, 17, which are insulating layers having the first insulating material as the main component, are adjusted to be in the same range. The thermal expansion coefficients of the insulating layers 15, 17 may be adjusted by, for example, adjusting the amount of filler included in each of the insulating layers 15, 17. The range of the thermal expansion coefficients of the insulating layers 15, 17 may be, for example, 43-49 ppm/° C. As long as the thermal expansion coefficients of the insulating layers 15, 17 are within the range of 43 ppm/° C. to 49 ppm/° C., the thermal expansion coefficient of the insulating layer 15 and the thermal expansion coefficient of the insulating layer 17 may be the same as each other or different from each other. It is to be noted that, the range of the thermal expansion coefficient in this description is 30° C. to 150° C. unless described otherwise.

The insulating layers 19, 21 are layered on the other surface of the first layered body. A layered body including the insulating layer 19, the wiring layer 20, the insulating layer 21, and the wiring layer 22 is an example of a second layered body according to an embodiment of the present invention. In this example, a second insulating material is a main component of the insulating layers 19, 21. For example, an epoxy type insulating resin may be used as the second insulating material.

The thermal expansion coefficients of the insulating layers 19, 21, which are insulating layers having the second insulating material as the main component, are adjusted to be in the same range. The thermal expansion coefficients of the insulating layers 19, 21 may be adjusted by, for example, adjusting the amount of filler included in each of the insulating layers 19, 21. The range of the thermal expansion coefficients of the insulating layers 19, 21 may be, for example, 35 ppm/° C. to 40 ppm/° C. As long as the thermal expansion coefficients of the insulating layers 19, 21 are within the range of 35 ppm/° C. to 40 ppm/° C., the thermal expansion coefficient of the insulating layer 19 and the thermal expansion coefficient of the insulating layer 21 may be the same as each other or different from each other.

Accordingly, the thermal expansion coefficients of the insulating layers 15, 17 (insulating layers having the first insulating material as the main component) are set to be larger than the thermal expansion coefficients of the insulating layers 19, 21 (insulating layers having the second insulating material as the main component). The same insulating resin (e.g., epoxy type insulating resin) may be used for the first insulating material and the second insulating material. Further, a filler may be included in each of the insulating layers having the first insulating material as the main component and in each of the insulating layers having the second insulating material as the main component. Accordingly, the amount of the filler included in the insulating layers having the first insulating material as the main component may be adjusted to be less than the amount of the filler included in the insulating layers having the second insulating material as the main component, so that the thermal expansion coefficients of the insulating layers can be adjusted to fall within the above-described ranges.

Further, the insulating layer 12 may be formed by using the same insulating resin as the insulating layers having the first insulating material as the main component. Further, the insulating layer 12 may include the same filler included in the insulating layers having the first insulating material as the main component. The amount of filler included in the insulating layer 12 may be less than, for example, the amount of filler included in the insulating layer having the second insulating material as the main component. Alternatively, the amount of filler included in the insulating layer 12 may be substantially the same as the amount of filler included in the insulating layer having the first insulating material as the main component.

In a case where the amount of filler included in the insulating layer 12 is adjusted to be substantially the same as the amount of filler included in the insulating layer having the first insulating material as the main component, the thermal expansion coefficient of the insulating layer 12 itself (i.e. the thermal expansion coefficient of the insulating layer 12 without the glass cloth 13) is adjusted to be within the same range (e.g., 43 ppm/° C. to 49 ppm/° C.) as the thermal expansion coefficient of the insulating layers having the first insulating material as the main component. However, by including the glass cloth 13 in the insulating layer 12, the value of the thermal expansion coefficient of the entire insulating layer 12 including the glass cloth 13 becomes less than the thermal expansion coefficient of the insulating layer 12 itself, and also less than the thermal expansion coefficient of the insulating layers having the second insulating material as the main component.

It is to be noted that the number of insulating layers having the first insulating material as the main component and the number of insulating layers having the second insulating material as the main component are to be equal. In this embodiment, the number of insulating layers having the first insulating material as the main component is two, and the number of insulating layers having the second insulating material as the main component is also two. However, number of insulating layers having the first insulating material as the main component and the number of insulating layers having the second insulating material as the main component are not limited to those described above. The number of insulating layers having the first insulating material as the main component and the number of insulating layers having the second insulating material as the main component may be indicated as n layers (n being a natural number), respectively.

In the first embodiment, the insulating layer including the glass cloth is arranged on a side of the wiring substrate that is opposite to the side on which the semiconductor chip is to be mounted. Further, the first layered body including a predetermined number of insulating layers having the first insulating material as the main component is formed on the other surface of the insulating layer including the glass cloth. Further, the second layered body including a predetermined number of insulating layers having the second insulating material as the main component is formed on the other surface of the first layered body. Further, the thermal expansion coefficient of the insulating layers having the first insulating material as the main component is set to be greater than the thermal expansion coefficient of the insulating layers having the second insulating material as the main component. Thereby, the thermal expansion coefficients of each of the insulating layers of the wiring substrate become balanced. Accordingly, warping of the wiring substrate can be reduced.

(Method for Manufacturing Wiring Substrate of First Embodiment)

Next, a method for manufacturing a wiring substrate according to the first embodiment is described. FIGS. 2A-3C are schematic diagrams illustrating processes for manufacturing the wiring substrate according to the first embodiment. Although FIGS. 2A-3C illustrate an example where a plurality of wiring substrates are obtained by forming a plurality of parts corresponding to the plurality of wiring substrates on a support member, removing the plurality of parts from the support member, and singulating the plurality of parts, the plurality of wiring substrates may be obtained by forming wiring substrates one at a time on a support member and removing the wiring substrate from the support member.

Figure 2A:
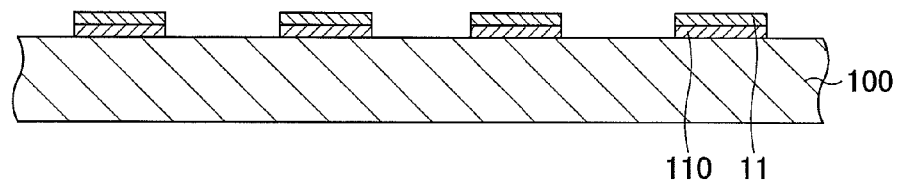
FIGS. 2A-3C are schematic diagrams illustrating processes for manufacturing a wiring substrate according to the first embodiment of the present invention.

First, in the process illustrated in FIG. 2A, a support member 100 is prepared. Then, an etching stop layer 110 and the wiring layer 11 are layered on a predetermined area(s) of the support body 100. For example, a silicon plate, a glass plate, a metal foil (e.g., copper foil, zinc foil) may be used as the support body. In this embodiment, copper foil is used as the support body 100. The copper foil is used because the copper foil can serve as a power feeding layer when performing an electroplating process and also because the copper foil can be easily removed by etching in the below-described process illustrated in FIG. 3B. The thickness of the support body 100 may be, for example, approximately 35 μm to 100 μm.

In order to form the etching stop layer 110 and the wiring layer 11, a resist layer including an opening(s) corresponding to the etching stop layer 110 and the wiring layer 11 is to be formed on the support body 11. More specifically, a liquid or a paste-like resist material including a photosensitive resin compound containing, for example, an epoxy type resin or an imide type resin is applied to the support body 100. Alternatively, a film-like resist material (e.g., dry film resist) including a photosensitive resin compound containing, for example, an epoxy type resin or an imide type resin may be laminated to the support body 100.

Then, the openings are formed in the applied or laminated resist material by exposing and developing the resist material. Alternatively, a film-like resist material that is already formed with openings may be laminated on the support member 100. The openings, which are formed in areas corresponding to the etching stop layer 110 and the wiring layer 11 of the support member, are arranged in a pitch of, for example, approximately 500 μm to 1200 μm. The opening part has, for example, a circular shape, from a plan view. The diameter of the circular shape may be, for example, approximately 200 μm to 1000 μm.

Then, the etching stop layer 110 and the wiring layer 11 are formed in the opening parts exposed on the resist layer formed on the support member 100. The etching stop layer 110 and the wiring layer 11 may be formed by, for example, an electroplating method using the support body 100 as a power feeding layer. Then, the resist layer is removed. The etching stop layer 110 is to be formed of a material that cannot be removed together with the removal of the support member 100 during the below-described process of removing the support member 100. Because copper foil is used as the support member 100 in this embodiment, the etching stop layer 110 may be a nickel (Ni) layer that cannot be removed by a copper etching liquid. The wiring layer 11 may be, for example, a copper (Cu) layer. As described above, the wiring layer 11 functions as an external connection pad.

Figure 2B:
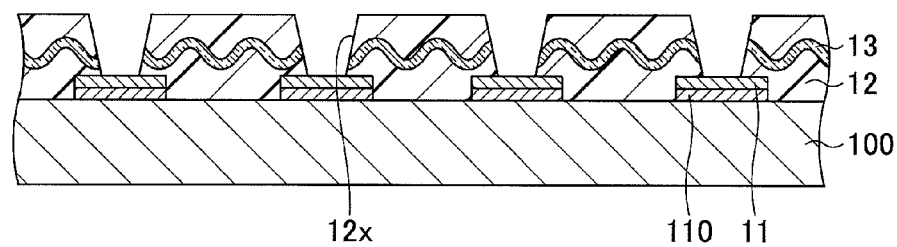

Then, in the process illustrated in FIG. 2B, a B-staged (semi-cured state) prepreg that has, for example, a thermosetting insulating resin impregnated in the glass cloth 40 is prepared. The thermosetting insulating resin may have an epoxy type resin as a main component. Then, the prepreg is laminated on the support body 100, so that the etching stop layer 110 and the wiring layer 11 become covered by the prepreg. Then, the prepreg is cured (set) by heating the prepreg to a temperature greater than or equal to a thermosetting temperature while applying pressure to the prepreg. Thereby, the insulating layer 12 including the glass cloth 13 is formed.

The thickness of the insulating layer 12 may be, for example, approximately 40 μm to 70 μm. The insulating layer 12 may include a filler such as silica ($SiO_2$) or alumina ($Al_2O_3$). Alternatively, a non-woven glass fabric or an aramid fiber may be used instead of the glass cloth 13.

Then, a via hole(s) 12x penetrating the insulating layer 12 and exposing the other surface of the wiring layer 11 is formed in the insulating layer 12. The via holes 12x are formed, for example, by a laser processing method using a $CO_2$ laser. After forming the via holes 12x, it is preferable to perform a desmear process for removing a residual resin adhered to the other surface of the first wiring layer 11 exposed at a bottom part of the via holes 12x.

Figure 2C:
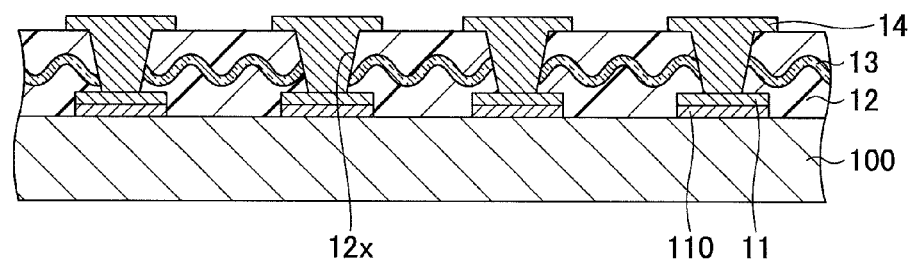

Then, in the process illustrated in FIG. 2C, the wiring layer 14 is layered on the insulating layer 12. The wiring layer 14 is constituted by a via wiring filling the inside of the via hole 12x and a wiring pattern formed on the insulating layer 12. The wiring layer 14 is electrically connected to the wiring layer 11 exposed at the bottom part of the via hole 12x. For example, copper (Cu) may be used as the material of the wiring layer 14. The thickness of the wiring pattern constituting the wiring layer 14 may be, for example, approximately 10 μm to 20 μm. The wiring layer 14 may be formed by using various wiring forming methods such as a semi-additive method or a subtractive method.

Figure 2D:
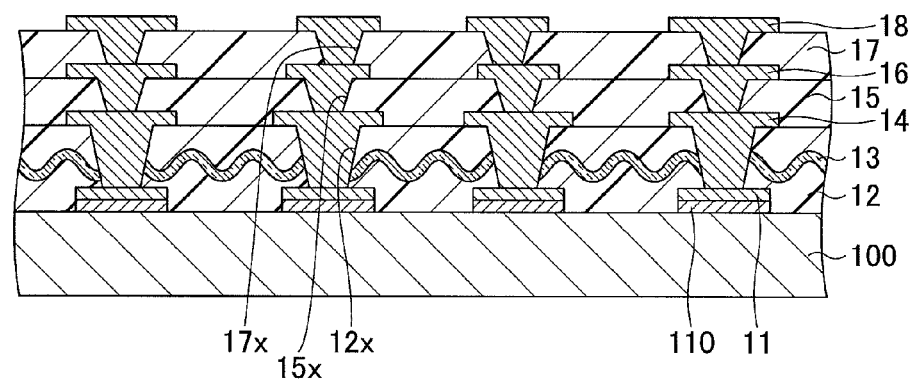

Then, in the process illustrated in FIG. 2D, the processes illustrated in FIGS. 2B and 2C are repeated. Thereby, the insulating layer 15, the wiring layer 16, the insulating layer 17, and the wiring layer 18 are sequentially formed on the insulating layer 12 in a manner covering the wiring layer 14. It is, however, to be noted that the glass cloth 13 is not formed in the insulating layers 15, 17. The insulating layer 15 is formed by applying a liquid or a paste-like thermosetting insulating resin on the insulating layer 12 positioned below the insulating layer 15 in a manner covering the wiring layer 14 and curing the thermosetting insulating resin. Likewise, the insulating layer 17 is formed by applying a liquid or a paste-like thermosetting insulating resin on the insulating layer 15 positioned below the insulating layer 17 in a manner covering the wiring layer 16. Alternatively, each of the insulating layers 15, 17 may be formed by laminating a film-like thermosetting insulating resin on corresponding insulating layers positioned below each of the insulating layers 15, 17 in a manner covering corresponding wiring layers and curing the laminated insulating resin.

Thereby, the first layered body including the insulating layer 15, the wiring layer 16, the insulating layer 17, and the wiring layer 18 is formed. The materials or the like for forming the insulating layer 15, the wiring layer 16, the insulating layer 17, and the wiring layer 18 are those described above. Further, the thermal expansion coefficients of the insulating layers 15, 17 (insulating layers having the first insulating material as the main component) are set to range from, for example, 43 ppm/° C. to 49 ppm/° C.

Figure 3A:
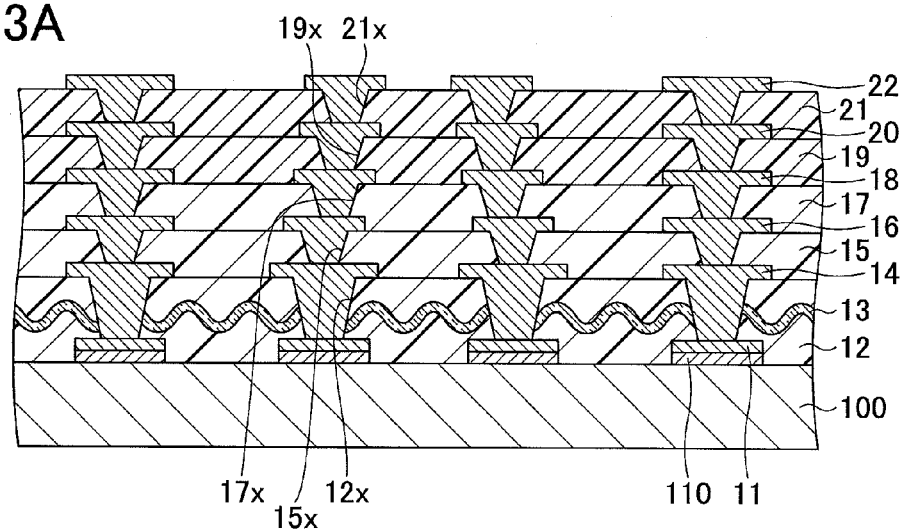

Then, in the process illustrated in FIG. 3A, the second layered body including the insulating layer 19, the wiring layer 20, the insulating layer 21, and the wiring layer 22 is formed on the first layered body. That is, similar to the process illustrated in FIG. 2D, the second layered body is formed by sequentially forming the insulating layer 19, the wiring layer 20, the insulating layer 21, and the wiring layer 22 on the insulating layer 17 in a manner covering the wiring layer 18. The materials or the like for forming the insulating layer 19, the wiring layer 20, the insulating layer 21, and the wiring layer 22 are those described above. Further, the thermal expansion coefficients of the insulating layers 19, 21 (insulating layers having the second insulating material as the main component) are set to range from, for example, 35 ppm/° C. to 40 ppm/° C.

It is to be noted that the number of insulating layers having the first insulating material as the main component and the number of insulating layers having the second insulating material as the main component are to be equal. In this embodiment, the number of insulating layers having the first insulating material as the main component is two, and the number of insulating layers having the second insulating material as the main component is also two. However, the number of insulating layers having the first insulating material as the main component and the number of insulating layers having the second insulating material as the main component are not limited to those described above. The number of insulating layers having the first insulating material as the main component and the number of insulating layers having the second insulating material as the main component may be indicated as n layers (n being a natural number), respectively.

Figure 3B:
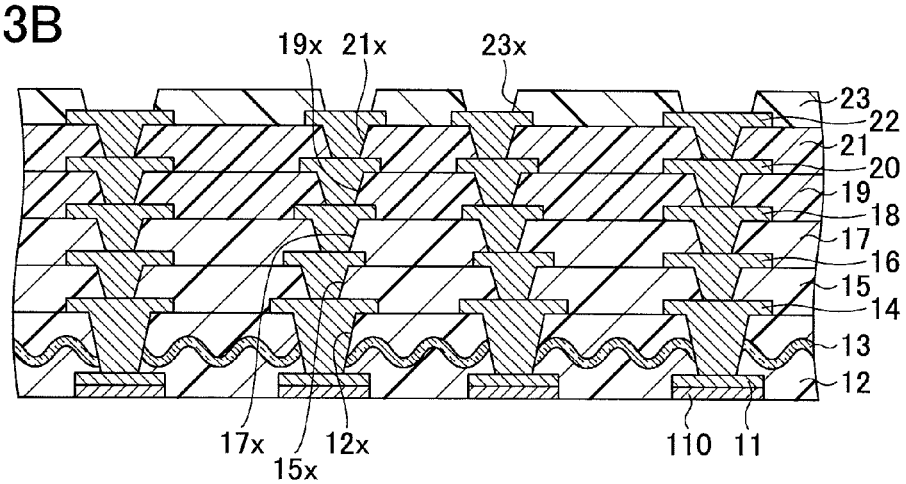

Then, in the process illustrated in FIG. 3B, the semiconductor chip mounting pad exposed from the other surface of the second layered body is formed. More specifically, first, the solder resist layer 23 covering the wiring layer 22 is formed on the insulating layer 21. The solder resist layer 23 covering the wiring layer 22 may be formed by applying a liquid or a paste-like photosensitive epoxy type resin on the insulating layer 21. The photosensitive epoxy type resin may be applied by using, for example, a screen-printing method, a roll-coating method, or a spin-coating method. Alternatively, a film-like photosensitive epoxy type resin covering the wiring layer 22 may be laminated on the insulating layer 21.

Then, the openings 23x are formed in the solder resist layer 23 by exposing and developing the applied or laminated insulating layer resin (photolithography method). It is to be noted that the openings 23x may be formed by using, for example, a laser processing method or a blasting method. The wiring layer 22 exposed at the bottom part of the opening 23x has, for example, a circular shape from a plan view. The diameter of the circular shape may be, for example, 40 μm to 120 μm. The pitch between the wiring layers 22 exposed at the bottom parts of the openings 23x may be, for example, 100 μm to 200 μm.

However, regarding the wiring layers 22 exposed at the bottom parts of the openings 23x, a portion(s) of the wiring layers 22 that is not connected to a semiconductor chip may have a diameter greater than the aforementioned diameter of approximately 40 μm to 120 μm and a pitch greater than the aforementioned pitch of approximately 100 μm to 200 μm.

According to necessity, a surface processing layer may be formed on the wiring layer 22 exposed at the bottom part of the opening 23x. The surface processing layer may be, for example, an Au layer, a Ni/Au (a metal layer including a Ni layer and an Au layer layered in this order), or a Ni/Pd/Au layer (a metal layer including a Ni layer, a Pd layer, and a Au layer layered in this order). Alternatively, the surface processing layer may be formed by performing an anti-oxidation process (e.g., OSP (Organic Solderability Preservative) process) on the wiring layer 22 exposed at the bottom part of the opening 23x.

Accordingly, in the process illustrated in FIG. 3B, semiconductor chip pads, which are the wiring layers 22 exposed at the bottom parts of the openings 23x, are formed. In other words, semiconductor chip pads, which are exposed outward from the other surface of the second layered body, are formed.

After the solder resist layer 23 is formed, the support body 100 illustrated in FIG. 3A is removed. The support body 100 being formed of copper foil may be removed by, for example, a wet-etching method in which a ferric chloride solution, a cupric chloride solution, or an ammonium persulfate solution is used. The etching stop layer 110 exposed from the insulating layer 12 is a layer that is formed of a material (e.g., nickel (Ni)) that cannot be removed by a copper etching solution used for removing the support body 100. The wiring layer 22 exposed at the bottom parts of the openings 23x is covered by a surface processing layer (e.g., gold (Au) layer). Thus, only the support body 100 can be removed by selectively etching the copper foil because the etching stop layer 110 is formed of a material that cannot be removed by the copper etching solution and the wiring layer 22 is covered by the surface processing layer.

However, the wiring layer 22 exposed at the bottom parts of the openings 23x would be etched together with the support body 100 formed of copper foil in a case where no surface processing layer (e.g., Au layer) is formed on the wiring layer 22 and the wiring layer 22 exposed at the bottom parts of the openings 23x is formed of copper (Cu). Therefore, in order to prevent the wiring layer 22 from being removed together with the support body 100, the wiring layer 22 exposed at the bottom parts of the openings 23x is to be masked.

Figure 3C:
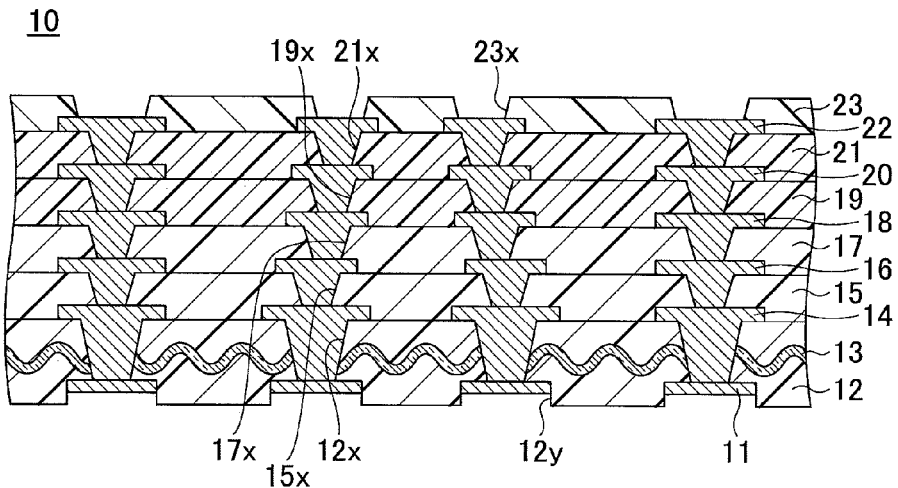

Then, in the process illustrated in FIG. 3C, the etching stop layer 110 is removed. In a case where the etching stop layer 110 is a nickel (Ni) layer, the etching stop layer 110 may be removed by, for example, a wet-etching method in which hydrogen peroxide or a nitrate type solution is used. By removing the etching stop layer 10, a recess 12y is formed on the one surface of the insulating layer 12. Thereby, the wiring layer 11 is exposed in the recess 12y. The depth of the recess 12y (i.e. distance from the one surface of the insulating layer 12 to the one surface of the wiring layer 11) may be, for example, approximately 10 μm to 20 μm.

After the process illustrated in FIG. 3C, the structural body illustrated in FIG. 3C is cut and singulated by, for example, dicing. Thereby, the manufacturing of a plurality of the wiring substrates 10 (see, for example, FIG. 1) is completed. Hence, the wiring substrate 10 including insulating layers that exhibit balanced thermal expansion coefficients can be manufactured. Thus, warping can be prevented from occurring in the wiring substrate 10.

<Second Embodiment>

The first embodiment describes an example of a wiring substrate in which the side of the solder resist layer corresponds to the side on which the semiconductor chip is mounted. The following second embodiment describes an example of a wiring substrate in which the side opposite to the solder resist layer corresponds to the side on which the semiconductor chip is mounted. In the second embodiment, like components are denoted with like reference numerals as those of the first embodiment and are not further explained.

(Structure of Wiring Substrate According to Second Embodiment of the Present Invention)

Figure 4:
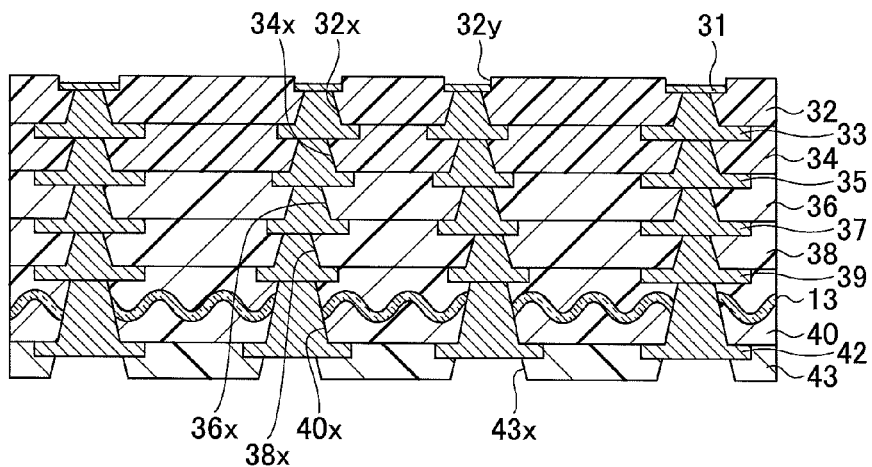
FIG. 4 is a cross-sectional view of a wiring substrate according to a second embodiment of the present invention.

First, a structure of a wiring substrate 30 according to the second embodiment of the present invention is described. FIG. 4 is a cross-sectional view of the wiring substrate 30 according to the second embodiment of the present invention. The wiring substrate 30 illustrated in FIG. 4 includes a wiring layer 31, an insulating layer 32, a wiring layer 33, an insulating layer 34, a wiring layer 35, an insulating layer 36, a wiring layer 37, an insulating layer 38, a wiring layer 39, an insulating layer 40, the glass cloth 13, a wiring layer 42, and a solder resist layer 43. The wiring substrate 30 is a coreless built-up wiring substrate.

In FIG. 4 and its corresponding description, for the sake of convenience, the term "one side" or the term "one surface" corresponds to a side or a surface that is positioned toward the solder resist layer 43, and the term "other side" or the term "other surface" corresponds to a side or surface that is positioned toward the insulating layer 32. For example, an exposed surface of the insulating layer 32 facing outward may be referred to as "other surface of the insulating layer 32", and a surface of the insulating layer 32 contacting the insulating layer 34 may be referred to as "one surface of the insulating layer 32".

In the wiring substrate 30, the other surface of the wiring layer 31 is exposed in a recess part 32y provided in the other surface of the insulating layer 32. In other words, the other surface of the wiring layer 31 is positioned more toward the insulating layer 34 than the other surface of the insulating layer 32. For example, copper (Cu) may be used as the material of the wiring layer 31. The thickness of the wiring layer 31 may be, for example, approximately 10 μm to 20 μm. The depth of the recess part 32y (distance from the other surface of the insulating layer 32 to the other surface of the wiring layer 31) may be, for example, approximately 10 μm to 20 μm.

At least a portion(s) of the wiring layer 31 exposed outward from the other surface of the insulating layer 32 functions as a semiconductor chip connection pad to which a semiconductor chip is to be electrically connected. That is, in the wiring substrate 30 according to the second embodiment, the side of the insulating layer 32 corresponds to the side to which a semiconductor chip is mounted. The wiring layer 31 exposed from the insulating layer 32 has, for example, a circular shape, from a plan view. The diameter of the circular shape may be, for example, approximately 40 μm to 120 μm. The pitch between the wiring layers 31 exposed from the insulating layer 32 may be, for example, approximately 100 μm to 200 μm.

However, regarding the wiring layers 31 exposed from the insulating layer 32, a portion(s) of the wiring layers 31 that is not connected to a semiconductor chip may have a diameter greater than the aforementioned diameter of approximately 40 μm to 120 μm and a pitch greater than the aforementioned pitch of approximately 100 μm to 200 μm.

The insulating layer 32 covers the one surface of the wiring layer 31 (excluding a portion of the wiring layer 31 contacting the below-described via wiring of the wiring layer 33) and a side surface of the wiring layer 31 and exposes the other surface of the wiring layer 31. For example, a thermosetting insulating resin having an epoxy resin as a main component may be used as the material of the insulating layer 32. The thickness of the insulating layer 32 may be, for example, approximately 20 μm to 40 μm. The insulating layer 32 may include a filler such as silica ($SiO_2$) or alumina ($Al_2O_3$).

The wiring layer 33 is formed on a side of the one surface of the insulating layer 32. More specifically, the wiring layer 33 is formed on the one surface of the insulating layer 32 and in a via hole 32x that penetrates the insulating layer 32 and exposes the one surface of the wiring layer 31. Thus, the wiring layer 33 is constituted by a via wiring filling the inside of the via hole 32x and a wiring pattern formed on the one surface of the insulating layer 32. The via hole 32x is a recess that is open on a side of the insulating layer 34 and has a circular truncated cone shape in which the area of an opening of the recess is larger than the area of the bottom surface of the recess. The diameter of the opening of the via hole 32x may be, for example, approximately 60 μm.

The wiring layer 33 is electrically connected to the wiring layer 31 exposed at a bottom part of the via hole 32x. For example, copper (Cu) may be used as the material of the wiring layer 33. The thickness of the wiring pattern constituting the wiring layer 33 may be, for example, approximately 10 μm to 20 μm.

The insulating layer 34 is formed on the one surface of the insulating layer 32 and covers the wiring layer 33. The material of the insulating layer 34 may be, for example, a thermosetting insulating resin having an epoxy resin as a main component. The thickness of the insulating layer 34 may be, for example, approximately 20 μm to 40 μm. The insulating layer 34 may include a filler such as silica ($SiO_2$) or alumina ($Al_2O_3$).

The wiring layer 35 is formed on a side of the one surface of the insulating layer 34. More specifically, the wiring layer 35 is formed on the one surface of the insulating layer 34 and in a via hole 34x that penetrates the insulating layer 34 and exposes the one surface of the wiring layer 33. Thus, the wiring layer 35 is constituted by a via wiring filling the inside of the via hole 34x and a wiring pattern formed on the one surface of the insulating layer 34. The via hole 34x is a recess that is open on a side of the insulating layer 36 and has a circular truncated cone shape in which the area of an opening of the recess is larger than the area of the bottom surface of the recess. The diameter of the opening of the via hole 34x may be, for example, approximately 60 μm.

The wiring layer 35 is electrically connected to the wiring layer 33 exposed at a bottom part of the via hole 34x. For example, copper (Cu) may be used as the material of the wiring layer 35. The thickness of the wiring pattern constituting the wiring layer 35 may be, for example, approximately 10 μm to 20 μm.

The insulating layer 36 is formed on the one surface of the insulating layer 34 and covers the wiring layer 35. The material of the insulating layer 36 may be, for example, a thermosetting insulating resin having an epoxy resin as a main component. The thickness of the insulating layer 36 may be, for example, approximately 20 μm to 40 μm. The insulating layer 36 may include a filler such as silica ($SiO_2$) or alumina ($Al_2O_3$).

The wiring layer 37 is formed on a side of the one surface of the insulating layer 36. More specifically, the wiring layer 37 is formed on the one surface of the insulating layer 36 and in a via hole 36x that penetrates the insulating layer 36 and exposes the one surface of the wiring layer 35. Thus, the wiring layer 37 is constituted by a via wiring filling the inside of the via hole 36x and a wiring pattern formed on the one surface of the insulating layer 36. The via hole 36x is a recess that is open on a side of the insulating layer 38 and has a circular truncated cone shape in which the area of an opening of the recess is larger than the area of the bottom surface of the recess. The diameter of the opening of the via hole 36x may be, for example, approximately 60 μm.

The wiring layer 37 is electrically connected to the wiring layer 35 exposed at a bottom part of the via hole 36x. For example, copper (Cu) may be used as the material of the wiring layer 37. The thickness of the wiring pattern constituting the wiring layer 37 may be, for example, approximately 10 μm to 20 μm.

The insulating layer 38 is formed on the one surface of the insulating layer 36 and covers the wiring layer 37. The material of the insulating layer 38 may be, for example, a thermosetting insulating resin having an epoxy resin as a main component. The thickness of the insulating layer 38 may be, for example, approximately 20 μm to 40 μm. The insulating layer 38 may include a filler such as silica ($SiO_2$) or alumina ($Al_2O_3$).

The wiring layer 39 is formed on a side of the one surface of the insulating layer 38. More specifically, the wiring layer 39 is formed on the one surface of the insulating layer 38 and in a via hole 38x that penetrates the insulating layer 38 and exposes the one surface of the wiring layer 37. Thus, the wiring layer 39 is constituted by a via wiring filling the inside of the via hole 38x and a wiring pattern formed on the one surface of the insulating layer 38. The via hole 38x is a recess that is open on a side of the insulating layer 40 and has a circular truncated cone shape in which the area of an opening of the recess is larger than the area of the bottom surface of the recess. The diameter of the opening of the via hole 38x may be, for example, approximately 60 μm.

The wiring layer 39 is electrically connected to the wiring layer 37 exposed at a bottom part of the via hole 38x. For example, copper (Cu) may be used as the material of the wiring layer 39. The thickness of the wiring pattern constituting the wiring layer 39 may be, for example, approximately μm to 20 μm.

The insulating layer 40 covering the wiring layer 39 is formed on the one surface of the insulating layer 38. The insulating layer 40 is a layer that has, for example, a thermosetting insulating resin impregnated in the glass cloth 13. The thermosetting insulating resin of the insulating layer 40 may have, for example, an epoxy resin as a main component. The thickness of the insulating layer 40 may be, for example, approximately 40 μm to 70 μm. The insulating layer 40 may include a filler such as silica ($SiO_2$) or alumina ($Al_2O_3$). The insulating layer 40 is a representative example of an insulating layer including a reinforcement member according to an embodiment of the present invention.

The wiring layer 42 is formed on a side of the one surface of the insulating layer 40. More specifically, the wiring layer 42 is formed on the one surface of the insulating layer 40 and in a via hole 40x that penetrates the insulating layer 40 and exposes the one surface of the wiring layer 39. Thus, the wiring layer 42 is constituted by a via wiring filling the inside of the via hole 40x and a wiring pattern formed on the one surface of the insulating layer 40. The via hole 40x is a recess that is open on a side of the solder resist layer 43 and has a circular truncated cone shape in which the area of an opening of the recess is larger than the area of the bottom surface of the recess. The diameter of the opening of the via hole 40x may be, for example, approximately 60 µm to 80 µm.

The wiring layer 42 is electrically connected to the wiring layer 39 exposed at a bottom part of the via hole 40x. For example, copper (Cu) may be used as the material of the wiring layer 42. The thickness of the wiring pattern constituting the wiring layer 42 may be, for example, approximately 10 µm to 20 µm.

The solder resist layer 43 is formed on the one surface of the insulating layer 40 and covers the wiring layer 42. The solder resist layer 43 includes an opening 43x having a bottom part at which a portion of the wiring layer 42 is exposed. The wiring layer 42 exposed at the bottom part of the opening 43x functions as an external connection pad to which a mounting substrate (not illustrated) such as a motherboard is to be electrically connected. The wiring layer 42 exposed at the bottom part of the opening 43x has, for example, a circular shape, from a plan view. The diameter of the circular shape may be, for example, approximately 200 µm to 1000 µm. The pitch between the wiring layers 42 exposed at the bottom parts of the openings 43x may be, for example, approximately 500 µm to 1200 µm.

According to necessity, a surface processing layer (i.e. a layer on which surface processing is performed) may be formed on the wiring layer 42 exposed at the bottom part of the opening 43x. The surface processing layer may be, for example, an Au layer, a Ni/Au (a metal layer including a Ni layer and an Au layer layered in this order), or a Ni/Pd/Au layer (a metal layer including a Ni layer, a Pd layer, and a Au layer layered in this order). Alternatively, the surface processing layer may be formed by performing an anti-oxidation process (e.g., OSP (Organic Solderability Preservative) process) on the wiring layer 42 exposed at the bottom part of the opening 43x.

In the wiring substrate 30, the wiring pattern constituting the wiring layer 42 may be drawn and formed on the one surface of the insulating layer 40. Thereby, the wiring pattern drawn to the one surface of the insulating layer 40 is exposed from the opening 43x of the solder resist layer 43, so that the wiring pattern may be used as a pad to which an external device or the like is connected (external connection pad). That is, a portion(s) of the wiring layer 42 other than a portion(s) formed in the via hole 40x may be used as the external connection pad.

Next, a configuration of the insulating layers, which is one of the features of the wiring substrate 30, is described. In an example where the insulating layer 40 including the glass cloth 13 is the lowermost layer of the wiring substrate 30, the insulating layers 38, 36 are layered on the other surface of the insulating layer 40. A layered body including the wiring layer 39, the insulating layer 38, the wiring layer 37, and the insulating layer 36 is another example of a first layered body according to an embodiment of the present invention. In this example, a first insulating material is a main component of the insulating layers 38 and 36. For example, an epoxy type insulating resin may be used as the first insulating material.

The thermal expansion coefficients of the insulating layers 38, 36, which are insulating layers having the first insulating material as the main component, are adjusted to be in the same range. The thermal expansion coefficients of the insulating layers 38, 36 may be adjusted by, for example, adjusting the amount of filler included in each of the insulating layers 38, 36. The range of the thermal expansion coefficients of the insulating layers 38, 36 may be, for example, 43 ppm/° C. to 49 ppm/° C. As long as the thermal expansion coefficients of the insulating layers 38, 36 are within the range of 43 ppm/° C. to 49 ppm/° C., the thermal expansion coefficient of the insulating layer 36 and the thermal expansion coefficient of the insulating layer 38 may be the same as each other or different from each other.

The insulating layers 34, 32 are layered on the other surface of the first layered body. A layered body including the wiring layer 35, the insulating layer 34, the wiring layer 33, and the insulating layer 32 is another example of a second layered body according to an embodiment of the present invention. In this example, a second insulating material is a main component of the insulating layers 34, 32. For example, an epoxy type insulating resin may be used as the second insulating material.

The thermal expansion coefficients of the insulating layers 34, 32, which are insulating layers having the second insulating material as the main component, are adjusted to be in the same range. The thermal expansion coefficients of the insulating layers 34, 32 may be adjusted by, for example, adjusting the amount of filler included in each of the insulating layers 34, 32. The range of the thermal expansion coefficients of the insulating layers 34, 32 may be, for example, 35 ppm/° C. to 40 ppm/° C. As long as the thermal expansion coefficients of the insulating layers 34, 32 are within the range of 35 ppm/° C. to 40 ppm/° C., the thermal expansion coefficient of the insulating layer 34 and the thermal expansion coefficient of the insulating layer 32 may be the same as each other or different from each other.

Accordingly, the thermal expansion coefficients of the insulating layers 38, 36 (insulating layers having the first insulating material as the main component) are set to be larger than the thermal expansion coefficients of the insulating layers 34, 32 (insulating layers having the second insulating material as the main component). The same insulating resin (e.g., epoxy type insulating resin) may be used for the first insulating material and the second insulating material. Further, a filler may be included in each of the insulating layers having the first insulating material as the main component and in each of the insulating layers having the second insulating material as the main component. Accordingly, the amount of the filler included in the insulating layers having the first insulating material as the main component may be adjusted to be less than the amount of the filler included in the insulating layers having the second insulating material as the main component, so that the thermal expansion coefficients of the insulating layers can be adjusted to fall within the above-described ranges.

Further, the insulating layer 40 may be formed by using the same insulating resin as the insulating layers having the first insulating material as the main component. Further, the insulating layer 40 may include the same filler included in the insulating layers having the first insulating material as the main component. The amount of filler included in the insulating layer 40 may be less than, for example, the amount of filler included in the insulating layer having the second insulating material as the main component. Alternatively, the amount of filler included in the insulating layer 40 may be substantially the same as the amount of filler included in the insulating layer having the first insulating material as the main component.

In a case where the amount of filler included in the insulating layer 40 is adjusted to be substantially the same as the amount of filler included in the insulating layer having the first insulating material as the main component, the thermal expansion coefficient of the insulating layer 40 itself (i.e. the thermal expansion coefficient of the insulating layer 40 without the glass cloth 13) is adjusted to be within the same range (e.g., 43 ppm/° C. to 49 ppm/° C.) as the thermal expansion coefficient of the insulating layers having the first insulating material as the main component. However, by including the glass cloth 13 in the insulating layer 40, the value of the thermal expansion coefficient of the entire insulating layer 40 including the glass cloth 13 becomes less than the thermal expansion coefficient of the insulating layer 40 itself, and also less than the thermal expansion coefficient of the insulating layers having the second insulating material as the main component.

It is to be noted that the number of insulating layers having the first insulating material as the main component and the number of insulating layers having the second insulating material as the main component are to be equal. In this embodiment, the number of insulating layers having the first insulating material as the main component is two, and the number of insulating layers having the second insulating material as the main component is also two. However, number of insulating layers having the first insulating material as the main component and the number of insulating layers having the second insulating material as the main component are not limited to those described above. The number of insulating layers having the first insulating material as the main component and the number of insulating layers having the second insulating material as the main component may be indicated as n layers (n being a natural number), respectively.

Hence, similar to the first embodiment, the second embodiment also provides the insulating layer that includes the glass cloth arranged on a side of the wiring substrate that is opposite to the side on which the semiconductor chip is to be mounted. Further, the first layered body including a predetermined number of insulating layers having the first insulating material as the main component is formed on the other surface of the insulating layer including the glass cloth. Further, the second layered body including a predetermined number of insulating layers having the second insulating material as the main component is formed on the other surface of the first layered body. Further, the thermal expansion coefficient of the insulating layers having the first insulating material as the main component is set to be greater than the thermal expansion coefficient of the insulating layers having the second insulating material as the main component. Thereby, the thermal expansion coefficients of each of the insulating layers of the wiring substrate become balanced. Accordingly, warping of the wiring substrate can be reduced.

(Method for Manufacturing Wiring Substrate of Second Embodiment)

The wiring substrate 30 of the second embodiment is manufactured by substantially the same method for manufacturing the wiring substrate 10 of the first embodiment. Therefore, although not illustrated in the drawings, the method for manufacturing the wiring substrate 30 of the second embodiment is briefly described as follows.

First, an etching stop layer and the wiring layer 31 are layered on the support body 100. As described above, the wiring layer 31 functions as a semiconductor connection pad. Then, the insulating layer 32, the wiring layer 33, the insulating layer 34, and the wiring layer 35 are formed on the support body 100 in a manner covering the etching stop layer and the wiring layer 31. The layered body including the insulating layer 32, the wiring layer 33, the insulating layer 34, and the wiring layer 35 is a representative example of the second layered body according to an embodiment of the present invention. In this example, the second insulating material is a main component of the insulating layers 32, 34. For example, an epoxy type insulating resin may be used as the second insulating material.

Then, the insulating layer 36, the wiring layer 37, the insulating layer 38, and the wiring layer 39 are formed on the insulating layer 34 in a manner covering the wiring layer 35. The layered body including the insulating layer 36, the wiring layer 37, the insulating layer 38, and the wiring layer 39 is a representative example of the first layered body according to an embodiment of the present invention. In this example, the first insulating material is a main component of the insulating layers 36, 38. For example, an epoxy type insulating resin may be used as the first insulating material.

Then, the insulating layer 40 including the glass cloth 13 is formed on the insulating layer 38 in a manner covering the wiring layer 39. That is, the insulating layer 40 including the glass cloth 13 is formed on the first layered body. Then, the wiring layer 42 and the solder resist layer 43 are sequentially formed on the insulating layer 40. Then, the openings 43x are formed in the solder resist layer 43. The wiring layer 42 exposed at the bottom parts of the opening 43x functions as the external connection pad. Then, the support body 100 is removed. Then, the etching stop layer is removed. Thereby, the manufacturing of the wiring substrate 30 is completed.

In the wiring substrate 30 according to the second embodiment, the side of the insulating layer 32 becomes the side to which a semiconductor chip is mounted. Therefore, the wiring substrate 30 is manufactured, so that the wiring layers 31 exposed from the insulating layer 32 have a smaller diameter and a narrower pitch compared to the wiring layers 42 exposed from the solder resist layer 43.

(Third Embodiment)

The third embodiment illustrates an example of a semiconductor package having a semiconductor chip mounted on a side of the second layered body of the wiring substrate 10 (see, for example, FIG. 1) of the first embodiment. In the third embodiment, like components are denoted with like reference numerals as those of the first and second embodiments and are not further explained.

Figure 5:
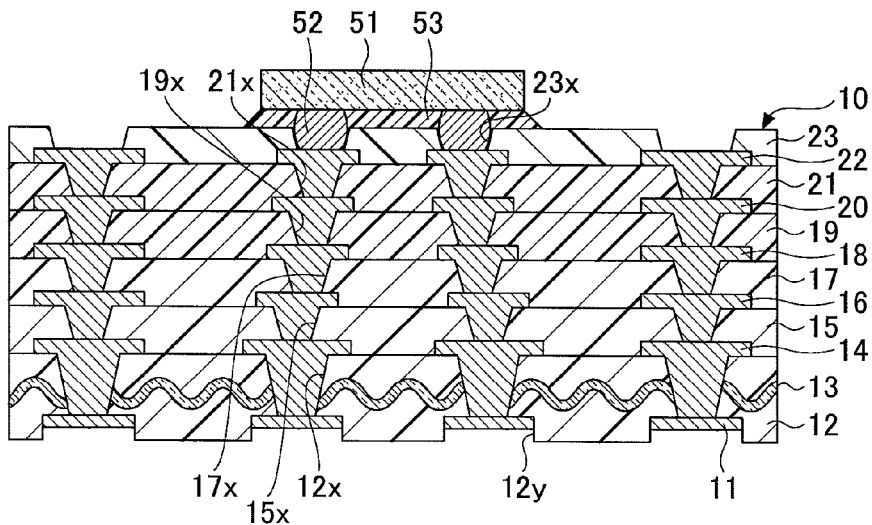
FIG. 5 is a cross-sectional view of a semiconductor package according to a third embodiment of the present invention.

FIG. 5 is a cross-sectional view of a semiconductor package 50 according to the third embodiment of the present invention. In FIG. 5, the semiconductor package 50 includes the wiring substrate 10 illustrated in FIG. 1, a semiconductor chip 51, a bonding part 52, and an underfill resin 53.

The wiring layer 22, which is exposed at the bottom part of the opening 23x of the solder resist layer 23 of the wiring substrate 10 (semiconductor chip connection pad), is electrically connected to an electrode pad (not illustrated) of the semiconductor chip 51 by way of the bonding part 52. For example, a solder ball may be used as the bonding part 52. The material of the solder ball may be, for example, an alloy including lead (Pb), an alloy including tin (Sn) and copper (Cu), an alloy including tin (Sn) and antimony (Sb), an alloy including tin (Sn) and silver (Ag), or an alloy including tin (Sn), silver (Ag), and copper (Cu). The underfill resin 53 is filled between the semiconductor chip 51 and the solder resist layer 23 of the wiring substrate 10.

According to the third embodiment, there can be obtained the semiconductor package 50 having the semiconductor chip 51 mounted on the wiring substrate 10 of the first embodiment. Because warping of the wiring substrate 10 is smaller compared to a wiring substrate of a related art example, a part(s) of a space between the wiring substrate 10 and the semiconductor chip 51 can be prevented from becoming larger than the diameter of the bonding part 52 due to warping of the wiring substrate 10. Accordingly, connection reliability between the wiring substrate 10 and the semiconductor chip 51 can be improved. It is to be noted that similar effects can be attained with respect to a semiconductor package having the semiconductor chip 51 mounted on a side of the insulating layer 32 of the wiring substrate 30 (see, for example, FIG. 4) of the second embodiment.

<Modified Example of Third Embodiment>

A modified example of the third embodiment illustrates an example of a semiconductor package having another semiconductor package mounted on the semiconductor package 50 (see, for example, FIG. 5) of the third embodiment. That is, the modified example of the third embodiment illustrates an example of a semiconductor package having a POP (Package On Package) structure. In the modified example of the third embodiment, like components are denoted with like reference numerals as those of the first, second, and third embodiments and are not further explained.

Figure 6:
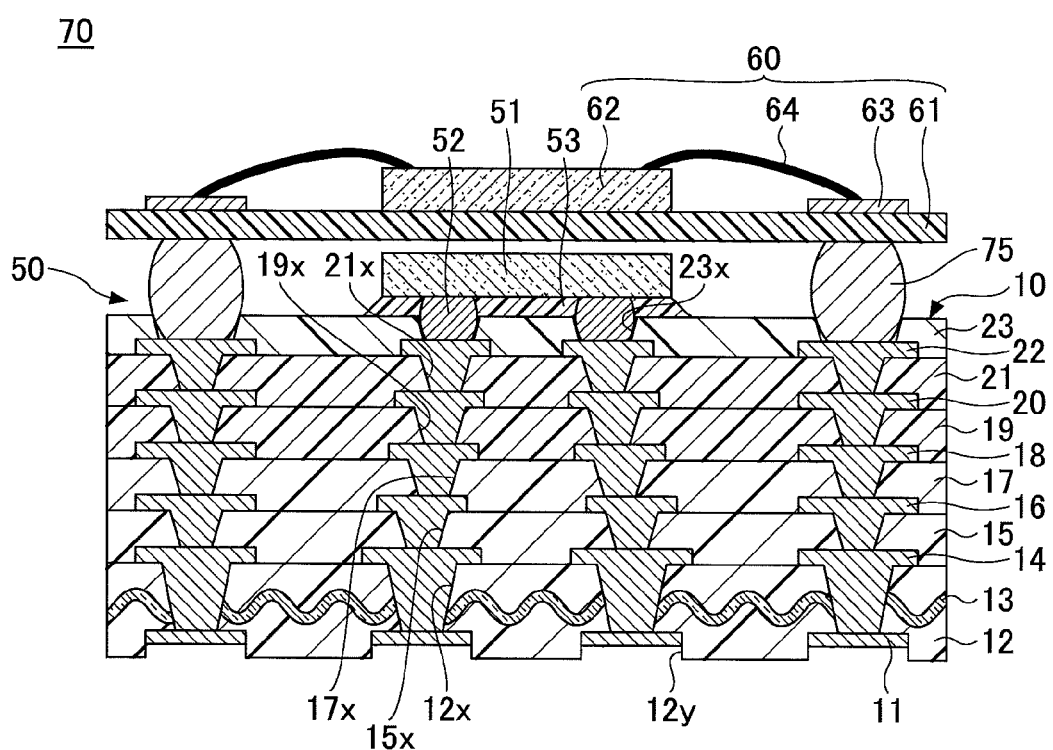
FIG. 6 is a cross-sectional view of a semiconductor package according to a modified example of the third embodiment.

FIG. 6 is a cross-sectional view of a semiconductor package 70 according to the modified example of the third embodiment. In FIG. 6, the semiconductor package 70 includes the semiconductor package 50 illustrated in FIG. 5, another semiconductor package 60, and a bonding part 75. The other semiconductor package 60 has a semiconductor chip 62 mounted on a substrate 61. In the other semiconductor package 60, an electrode pad (not illustrated) of the semiconductor chip 62 and a pad 63 of the substrate 61 are electrically connected by way of a bonding wire 64.

The substrate 61 includes a pad (not illustrated) facing the wiring substrate 10 and being electrically connected to the wiring layer 22 exposed at the bottom part of the opening 23x of the solder resist layer 23 of the wiring substrate 10 by way of the bonding part 75. For example, a solder ball may be used as the bonding part 75. The material of the solder ball may be, for example, an alloy including lead (Pb), an alloy including tin (Sn) and copper (Cu), an alloy including tin (Sn) and antimony (Sb), an alloy including tin (Sn) and silver (Ag), or an alloy including tin (Sn), silver (Ag), and copper (Cu).

According to the modified example of the third embodiment, there can be obtained the semiconductor package 70 (POP structure semiconductor package) that has the other semiconductor package 60 mounted on the semiconductor package 50 of the third embodiment. Because warping of the wiring substrate 10 is smaller compared to a wiring substrate of a related art example, a part(s) of a space between the wiring substrate 10 and the substrate 61 can be prevented from becoming larger than the diameter of the bonding part 75 due to warping of the wiring substrate 10. Accordingly, connection reliability between the wiring substrate 10 and the substrate 61 can be improved. It is to be noted that, similar effects can be attained with respect to a POP structure semiconductor package using the wiring substrate 30 (see, for example, FIG. 4) of the second embodiment.

<Comparison of Warping>

A comparison of warping was conducted where the wiring substrate 10 as illustrated in FIG. 1 (hereinafter referred to as "example 1"), the wiring substrate 10 prior to being singulated as illustrated in FIG. 3 (hereinafter referred to as "example 2"), a wiring substrate of a comparative example (hereinafter referred to as "comparative example 1"), and a wiring substrate of a comparative example prior to being singulated (hereinafter referred to as "comparative example 2") were used. The differences between the comparative examples 1, 2 and the examples 1, 2 are only the settings of the thermal expansion coefficients of the insulating layers.

TABLE 1

|  |  | EXAMPLE 1 | COMPARATIVE EXAMPLE 1 | EXAMPLE 2 | COMPARATIVE EXAMPLE 2 |
|---|---|---|---|---|---|
| THERMAL EXPANSION COEFFICIENT (ppm/° C.) | INSULATING LAYERS 15, 17 | 43~49 | 35~40 | 43~49 | 35~40 |
|  | INSULATING LAYERS 19, 21 |  | 35~40 |  | 35~40 |
| DIMENSION (mm) |  |  | DEPTH 18 × WIDTH 18 × THICKNESS 0.3 |  | DEPTH 75 × WIDTH 250 × THICKNESS 0.3 |

The comparison of warping in a state subsequent to a singulation process (i.e. comparison of warping between example 1 and comparative example 1) was performed by calculation. The comparison of warping in a state prior to a singulation process (sheet state) was conducted by actual measurement. The results of the calculation and the actual measurement are illustrated in (Table 2).

TABLE 2

|  | EXAMPLE 1 | COMPARATIVE EXAMPLE 1 | EXAMPLE 2 | COMPARATIVE EXAMPLE 2 |
|---|---|---|---|---|
| CALCULATION RESULT OF WARPING (mm) | 0.016 | 0.033 | — | — |
| MEASUREMENT RESULT OF WARPING (mm) | — | — | 2.1 | 3.6 |

According to the comparison of warping subsequent to the singulation process, the warping of the example 1 is no greater than ½ of the warping of the comparative example 1, as illustrated in Table 2. Further, according to the comparison of warping prior to the singulation process (sheet state), the warping of the example 2 is no greater than ⅔ of the warping of the comparative example 2, as illustrated in Table 2. In any case, it has been confirmed that the warping of the examples 1, 2 is significantly reduced compared to the warping of the comparative examples 1, 2.

That is, in comparison with a case of setting the insulating layers of a wiring substrate with substantially the same thermal expansion coefficients, warping of a wiring substrate can be significantly reduced by: forming insulating layers having a first insulating material as a main component in the same number as the number of insulating layers having a second insulating material as a main component; and setting a higher thermal expansion coefficient for the insulating layers having the first insulating material as the main component than a thermal expansion coefficient set for the insulating layers having the second insulating material as the main component.

Various aspects of the subject-matter described herein are set out non-exhaustively in the following numbered clauses:

1. A method for manufacturing a wiring substrate, the method comprising:

forming a first electrode pad on a support body;

forming an insulating layer including a reinforcement member on the support body, the first insulating layer covering the first electrode pad;

forming a first layered body including a plurality of first insulating layers on the insulating layer including the reinforcement member, the plurality of first insulating layers having a first insulating material as a main component;

forming a second layered body including a plurality of second insulating layers on the first layered body, the plurality of second insulating layers having a second insulating material as a main component;

forming a second electrode pad that is exposed from a surface of the second layered body that is opposite to the first layered body; and removing the support body;

wherein the number of the plurality of first insulating layers is equal to the number of the plurality of second insulating layers, wherein the plurality of first insulating layers has a thermal expansion coefficient that is greater than a thermal expansion coefficient of the plurality of second insulating layers.

2. The method of clause 1, wherein the forming of the first electrode pad includes forming an external connection pad to which an external device is electrically connected, wherein the forming of the second electrode pad includes forming a semiconductor chip connection pad to which a semiconductor chip is electrically connected.

3. A method for manufacturing a wiring substrate, the method comprising:

forming a first electrode pad on a support body;

forming a second layered body that covers the first electrode pad on the support body, the second layered body including a plurality of second insulating layers having a second insulating material as a main component;

forming a first layered body including a plurality of first insulating layers on the second layered body, the plurality of first insulating layers having a first insulating material as a main component;

forming an insulating layer including a reinforcement member on the first layered body;

forming a second electrode pad on the insulating layer including the reinforcement member; and removing the support body;

wherein the number of the plurality of first insulating layers is equal to the number of the plurality of second insulating layers, wherein the plurality of first insulating layers has a thermal expansion coefficient that is greater than a thermal expansion coefficient of the plurality of second insulating layers.

4. The method of clause 3, wherein the forming of the first electrode pad includes forming a semiconductor chip connection pad to which a semiconductor chip is electrically connected, wherein the forming of the second electrode pad includes forming an external connection pad to which an external device is electrically connected.

All examples and conditional language recited herein are intended for pedagogical purposes to aid the reader in understanding the invention and the concepts contributed by the inventor to further the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

For example, instead of manufacturing the above-described coreless wiring substrate by layering wiring layers and insulating layers on a single side of a support body with a built-up method and removing the support body in a final process, a coreless wiring substrate may be manufactured by layering a wiring layer(s) and an insulating layer(s) on both sides of a support body with a built-up method and removing the support body in a final process.

Further, instead of using an etching stop layer, a gold (Au) layer may be used. In this case, an Au layer is formed on the wiring layer 11 of the wiring substrate 10 or the wiring layer 31 of the wiring substrate 30, so that the Au layer functions as a pad exposed outward of the wiring substrate 10 or the wiring substrate 30. Alternatively, instead of using the Au layer, a Ni/Au (a metal layer including a Ni layer and an Au layer layered in this order) or a Ni/Pd/Au layer (a metal layer including a Ni layer, a Pd layer, and a Au layer layered in this order) may be formed, so that the Au layer included in the metal layer is exposed outward of the wiring substrate 10 or the wiring substrate 30.

What is claimed is:

1. A wiring substrate comprising:

an insulating layer including a reinforcement member and having a first surface and a second surface positioned on an opposite side of the first surface;

a first electrode pad that is exposed from the first surface of the insulating layer including the reinforcement member;

a first layered body including a plurality of first insulating layers and being formed on the second surface of the insulating layer including the reinforcement member, the plurality of first insulating layers having a first insulating material as a main component;

a second layered body including a plurality of second insulating layers and being formed on the first layered body, the plurality of second insulating layers having a second insulating material as a main component; and a second electrode pad that is exposed from a surface of the second layered body that is opposite to the first layered body;

wherein the number of the plurality of first insulating layers is equal to the number of the plurality of second insulating layers, wherein the plurality of first insulating layers has a thermal expansion coefficient that is greater than a thermal expansion coefficient of the plurality of second insulating layers, wherein the first and the second insulating materials each include an epoxy type insulating resin, wherein the plurality of the first and the second insulating layers each include a filler, wherein an amount of the filler included in the plurality of first insulating layers is less than an amount of the filler included in the plurality of second insulating layers.

2. The wiring substrate as claimed in claim 1, wherein the insulating layer including the reinforcement member is formed of the same insulating resin included in the plurality of first insulating layers, wherein the insulating layer including the reinforcement member includes the same filler as the filler included in the plurality of first insulating layers, wherein an amount of the filler included in the insulating layer including the reinforcement member is less than the amount of the filler included in the plurality of second insulating layers.

3. The wiring substrate as claimed in claim 1, wherein the insulating layer including the reinforcement member has a thermal expansion coefficient that is less than the thermal expansion coefficient of the plurality of first insulating layers and less than the thermal expansion coefficient of the plurality of second insulating layers.

4. The wiring substrate as claimed in claim 1,
wherein the first electrode pad is configured to be electrically connected to a mounting substrate,
wherein the second electrode pad is configured to be electrically connected to a semiconductor chip.

5. A semiconductor package comprising:
a bonding part;
the wiring substrate as claimed in claim 1; and
a semiconductor chip that is mounted on the second layered body by way of the bonding part;
wherein the semiconductor chip is configured to be electrically connected to the second electrode pad interposed by the bonding part.

6. The semiconductor package as claimed in claim 5, further comprising:
another bonding part;
another semiconductor package including a substrate and another semiconductor chip mounted on the substrate, the another semiconductor package being positioned on the second layered body on which the semiconductor chip is mounted;
wherein the another semiconductor chip is configured to be electrically connected to the wiring substrate interposed by the substrate and the another bonding part.

7. A wiring substrate comprising:
an insulating layer including a reinforcement member and having a first surface and a second surface positioned on an opposite side of the first surface;
a first electrode pad that is exposed from the first surface of the insulating layer including the reinforcement member;
a first layered body including a plurality of first insulating layers and being formed on the second surface of the insulating layer including the reinforcement member, the plurality of first insulating layers having a first insulating material as a main component;
a second layered body including a plurality of second insulating layers and being formed on the first layered body, the plurality of second insulating layers having a second insulating material as a main component; and
a second electrode pad that is exposed from a surface of the second layered body that is opposite to the first layered body;
wherein the plurality of first insulating layers has a thermal expansion coefficient that is greater than a thermal expansion coefficient of the plurality of second insulating layers,
wherein the first and the second insulating materials each include an epoxy type insulating resin,
wherein the plurality of the first and the second insulating layers each include a filler,
wherein an amount of the filler included in the plurality of first insulating layers is less than an amount of the filler included in the plurality of second insulating layers.

* * * * *